(12) United States Patent
Higashitani et al.

(10) Patent No.: US 7,247,508 B2
(45) Date of Patent: Jul. 24, 2007

(54) SEMICONDUCTOR DEVICE WITH INTERMEDIATE CONNECTOR

(75) Inventors: Hideki Higashitani, Kyoto (JP); Tadashi Nakamura, Osaka (JP); Daizo Andoh, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 170 days.

(21) Appl. No.: 11/064,282

(22) Filed: Feb. 23, 2005

(65) Prior Publication Data
US 2005/0142693 A1 Jun. 30, 2005

Related U.S. Application Data

(62) Division of application No. 10/131,992, filed on Apr. 25, 2002, now abandoned.

(30) Foreign Application Priority Data
Apr. 20, 2001 (JP) ............................. 2001-127778

(51) Int. Cl.
*H01L 21/66* (2006.01)
(52) U.S. Cl. .................. 438/17; 257/E21.521
(58) Field of Classification Search ................ 438/478, 438/184, 193, 195–198, 200–207, 209–211, 438/218, 237, 165, 248, 168, 343, 294, 308, 438/6, 10, 107–114, 104, 118, 121–123, 128–129, 438/135, 142, 145, 149, 151, 157, 176
See application file for complete search history.

(56) References Cited

U.S. PATENT DOCUMENTS

| | | | |
|---|---|---|---|
| 4,661,192 A | 4/1987 | McShane | |
| 4,818,728 A | 4/1989 | Rai et al. | |
| 5,341,564 A | 8/1994 | Akhavain et al. | |
| 5,611,140 A | 3/1997 | Kulesza et al. | |
| 5,768,109 A | 6/1998 | Gulick et al. | |
| 5,808,874 A * | 9/1998 | Smith | ........................ 361/769 |
| 6,051,093 A | 4/2000 | Tsukahara | |
| 6,074,893 A | 6/2000 | Nakata et al. | |
| 6,130,111 A | 10/2000 | Ikuina et al. | |
| 6,190,940 B1 | 2/2001 | DeFelice et al. | |

(Continued)

FOREIGN PATENT DOCUMENTS

CN 1195422 10/1998

(Continued)

*Primary Examiner*—Michael Lebentritt
*Assistant Examiner*—Andre' Stevenson
(74) *Attorney, Agent, or Firm*—RatnerPrestia

(57) ABSTRACT

A semiconductor element and a circuit substrate each having electrodes disposed at narrow pitch are electrically connected with high reliability by conductive paste. A semiconductor device with a semiconductor section and a circuit substrate electrically connected and a method for manufacturing such semiconductor device are provided. The manufacturing method includes processes of: forming semiconductor electrodes at the semiconductor section; forming substrate electrodes at the circuit substrate; firstly affixing one part of the semiconductor section and circuit substrate to an intermediate connector made of insulating material; forming via holes at intermediate connector according to positions of the semiconductor electrodes and positions of the substrate electrodes; electrically connecting each semiconductor electrode and each substrate electrode via each via hole; and secondly affixing the other part of the semiconductor section and circuit substrate to the intermediate connector.

13 Claims, 13 Drawing Sheets

U.S. PATENT DOCUMENTS

| | | | |
|---|---|---|---|
| 6,202,298 B1 * | 3/2001 | Smith | 29/840 |
| 6,329,610 B1 * | 12/2001 | Takubo et al. | 174/264 |
| 6,375,064 B1 | 4/2002 | Edasawa et al. | |
| 6,410,364 B1 | 6/2002 | Hashimoto | |
| 6,531,022 B1 | 3/2003 | Tsukahara | |
| 6,720,500 B1 | 4/2004 | Inoue | |
| 6,774,306 B2 * | 8/2004 | Smith | 174/541 |

FOREIGN PATENT DOCUMENTS

| | | |
|---|---|---|
| EP | 0 853 337 | 7/1998 |
| JP | 05-198697 | 8/1993 |
| JP | 05-251505 | 9/1993 |
| JP | 6-224259 | 8/1994 |
| JP | 7-86331 | 3/1995 |
| JP | 8-8511 | 1/1996 |
| JP | 10-041347 | 2/1998 |
| JP | 11-204573 | 7/1999 |
| JP | 2000-58592 | 2/2000 |

* cited by examiner

SEMICONDUCTOR DEVICE WITH INTERMEDIATE CONNECTOR

This application is a divisional of application Ser. No. 10/131,992, filed Apr. 25, 2002, now abandoned.

BACKGROUND OF THE INVENTION

1. Field of the Invention

The present invention relates to a technology for mounting semiconductor elements to a circuit substrate at a high density.

2. Description of Background Arts

The packaging density of semiconductor elements has been remarkably increased. In order to meet a decrease in packaging area and an increase in number of electrodes, various high-density packaging methods have been proposed in recent years. As one example, there is a method for facedown-mounting semiconductor elements with bumps formed at the electrode section to circuit substrates (U.S. Patent Publication No. 4,661,192, Laid-open Japanese patent publication No. 6-224259). FIG. 1 is a cross-sectional view of a conventional semiconductor device facedown-mounted.

The conventional semiconductor device shown in FIG. 1 comprises a semiconductor element 901, circuit substrate 907, protruding electrode 905 and conductive paste 909 which electrically connects the semiconductor element 901 to circuit substrate 907, and sealing resin 911.

Circuit substrate 907 is, for example, a multilayer circuit substrate with all the layers having an interstitial via hole (IVH) construction, and an electrode 913 is installed for securing electrical connections with semiconductor element 901. To semiconductor element 901, a plurality of electrodes 903 are formed. To each of electrodes 903, protruding electrode 905 is installed, and conductive paste 909 covers part of it. Semiconductor 901 and circuit substrate 907 are electrically connected by pressing conductive paste 909 to electrode 913 by protruding electrode 905. Sealing resin 911 is filled between semiconductor element 901 and circuit substrate 907 as if they fill the clearance of both. Thus, semiconductor element 901 can be fixed to circuit substrate 907.

Referring now FIG. 2A through 2E, a packaging method of the conventional semiconductor device will be specifically described.

FIG. 2A is a diagram showing the semiconductor element. Semiconductor element 901 has electrode 903. First of all, on electrode 903, bump 905 is formed using a wire bonding method. Bump 905 has a 2-level protruding form. The procedure for forming the bump is described as follows. First of all, a ball formed at an Au wire head end is thermally crimped to electrode 903 and the lower level section of a 2-level protrusion is formed. Then, using an Au wire loop formed by moving a capillary, the upper level section is formed. Under this condition, the heights of the 2-level protruded bumps are not uniform and the evenness at the head end section also lacks. Consequently, pressurizing the 2-level protruded bump, the height is uniformalized and the head end section is leveled. In this way, bump 905 is formed on electrode 903.

FIG. 2B is a diagram showing semiconductor element 901 with conductive paste 909 applied. The conductive paste 909 is transferred and formed on bump 905. Specifically, for example, conductive paste 909 is applied on a rotating disk in a uniform thickness using a doctor blade method and against the conductive paste 909 applied, bump 905 is pressed and pulled up to carry out transferring.

FIG. 2C is a diagram showing semiconductor element 901 and circuit substrate 907 before aligning. Aligning is carried out by accurately connecting bump 905 on semiconductor element 901 to electrode 913 on circuit substrate 907.

FIG. 2D is a diagram showing semiconductor element 901 and circuit substrate 907 after aligning. Conductive paste 909 on bump 905 is pressed against electrode 913 on circuit substrate 907 and conductive paste 909 is heated to harden. Thus, bump 905 and electrode 913 are electrically and physically joined.

FIG. 2E is a diagram showing semiconductor element 901 and circuit substrate 907 after sealing with resin 911. Resin 911 is epoxy-based material. To the periphery of semiconductor element 901 and the clearance between semiconductor element 901 and circuit substrate 907, resin 911 is injected and sealing is achieved by hardening resin 911. In this way, by resin-molding circuit substrate 907 and semiconductor element 901, a conventional semiconductor device with semiconductor element 901 flip-chip bonded to circuit substrate 907 is completed.

With respect to FIG. 2B, the amount of conductive paste 909 transferred and formed on each bump 905 is inevitably varied to a certain degree for each bump 905. Consequently, when electrode 903 of semiconductor element 901 and electrode 913 of circuit substrate 907 are electrically connected, pressing bump 905 with a large transferring volume of conductive paste 909 against electrode 913 may cause conductive paste 905 to spread to adjacent electrodes or conductive paste and may result in shorting. This causes problems particularly when the clearances between electrodes 903 and electrodes 913 are narrow.

SUMMARY OF THE INVENTION

It is an object of the present invention to electrically connect with high reliability a semiconductor element with electrodes disposed at a narrow pitch to a circuit substrate by conductive paste.

According to the present invention, an intermediate connector is provided between a semiconductor section and a circuit substrate. Via holes are formed in the intermediate connector. Because inside each via hole, the conductive paste are sealed in to secure electrical connections between the semiconductor section and the circuit substrate, the conductive paste would not spread from the each via hole to the outside. Consequently, shorting of adjoining electrical connections can be prevented. Further, semiconductor elements with electrodes disposed at a narrow pitch and circuit substrates can be electrically connected with high reliability by conductive paste.

The conductive paste is used for electrical connections between the semiconductor section and the circuit substrate. Thus, concentration of the stress applying only to the joining section of the semiconductor section and the circuit substrate can be relaxed. Consequently, stable electrical connections can be achieved with respect to dimensional changes caused by thermal shocks, etc.

More specifically, a method for manufacturing a semiconductor device with a semiconductor section and a circuit substrate electrically connected, includes: a forming process which forms semiconductor electrodes at the semiconductor section, a forming process which forms substrate electrodes on the circuit substrate, a first affixing process which affixes one part of the semiconductor section and the circuit substrate to an intermediate connector made of insulating material, a forming process which forms via hole s in the intermediate connector according to positions of the semiconductor electrodes and positions of the substrate electrodes, a connecting process which electrically connects each of the semiconductor electrodes and each of the substrate electrodes via each of the via holes, and a second affixing process which affixes the other part of the semiconductor section and the circuit substrate to the intermediate connector. Therefore, the above object can be achieved.

The connecting process may include: a forming process which forms bumps on at least one of the semiconductor electrodes and the substrate electrodes; a filling process which fills conductive paste into the each via hole; and a connecting process which buries each of the bumps in the conductive paste in the each via hole to electrically connect the each semiconductor electrode and the each substrate electrode via the each bump and the conductive paste.

The forming process which forms via holes may include: a measuring process which measures at least one of positions of the semiconductor electrodes and positions of the substrate electrodes to obtain positional data; a specifying process which specifies positions on the intermediate connector based on the measured positional data; and a forming process which forms the each via hole at each of the specified positions on the intermediate connector.

Each of the semiconductor electrodes and each of the substrate electrodes may be metal layers with films, each metal layer containing resin formed on the surface. Further, the forming process which forms the via holes may remove the films to expose the metal layers.

The forming process which forms the via holes may form each wall surface inclined.

The filling process may include: an injecting process which injects the conductive paste from the bottom to the opening section of the each via hole; and a scraping process which scraps away a predetermined volume of the conductive paste from the opening section.

The injecting process may apply pressure to the conductive paste to discharge the conductive paste and injects the conductive paste from the bottom to the opening section of the each via hole.

The first affixing process and the second affixing process may bring the intermediate connector in close contact with the semiconductor section and the circuit substrate by pressurizing and include a sealing process which seals the each via hole.

The conductive paste may contain conductive particles and non-conductive resin. Further, the sealing process may include: a providing process which provides a clearance, through which the nonconductive resin alone to flow, at an interface between the intermediate connector and at least one part of the semiconductor section and the circuit substrate; and a densifying process which densifies the conductive paste by pressurizing and allowing the nonconductive resin to flow from the each via hole to seal the each via hole with the conductive particles remained.

The intermediate connector may be further made of a material that contracts by pressurizing, and the first affixing process and the second affixing process may contract the intermediate connector by pressurizing to densify the conductive paste.

The intermediate connector may be further made of thermosetting resin, and the first affixing process may harden part of the intermediate connector containing thermosetting resin by heating to affix the semiconductor section and the circuit substrate to the intermediate connector.

The second affixing process may harden the intermediate connector by heating to affix the semiconductor section and the circuit substrate to the intermediate connector.

The injecting process may apply pressure to the conductive paste to discharge with volume smaller than first volume of each via hole and greater than second volume obtained by subtracting volume of each bump from the first volume.

The each bump may have a two-level protrusion form.

Other objects and attainments together with a fuller understanding of the invention will become apparent and appreciated by referring to the following description and claims taken in conjunction with the accompanying drawings.

BRIEF DESCRIPTION OF THE DRAWINGS

This and other objects and features of the present invention will become clear from the subsequent description of a preferred embodiment thereof made with reference to the accompanying drawings, in which like parts are designated by like reference numerals and in which.

DETAILED DESCRIPTION OF THE PREFERRED EMBODIMENTS

Figure 1:
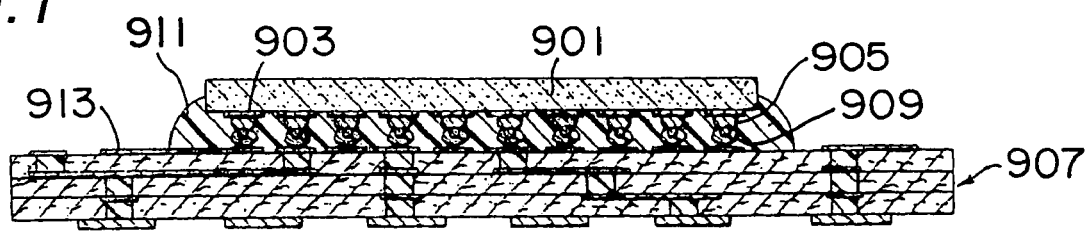
FIG. 1 is a cross-sectional view of a facedown-mounted conventional semiconductor device.
Figure 2A:
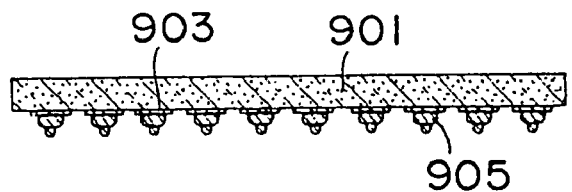
FIGS. 2A through 2E are diagrams explaining a mounting process of the conventional semiconductor device.
Figure 2B:
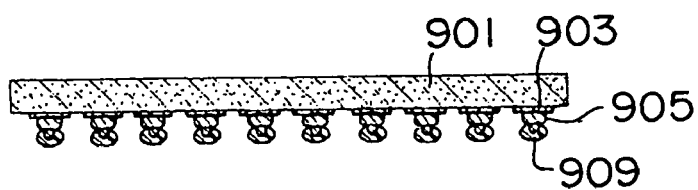
Figure 2C:
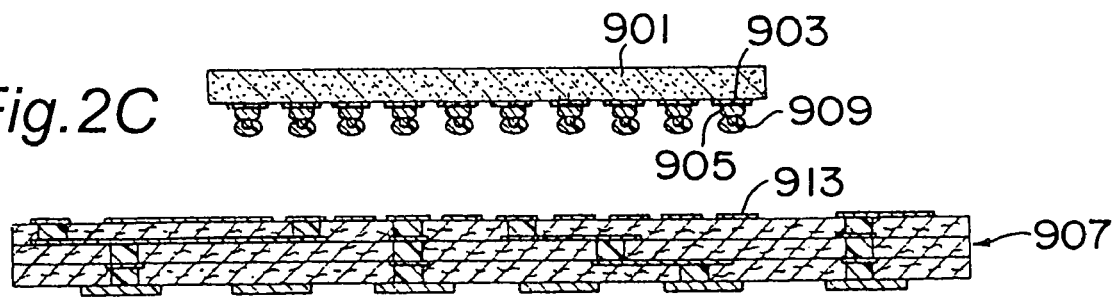
Figure 2D:
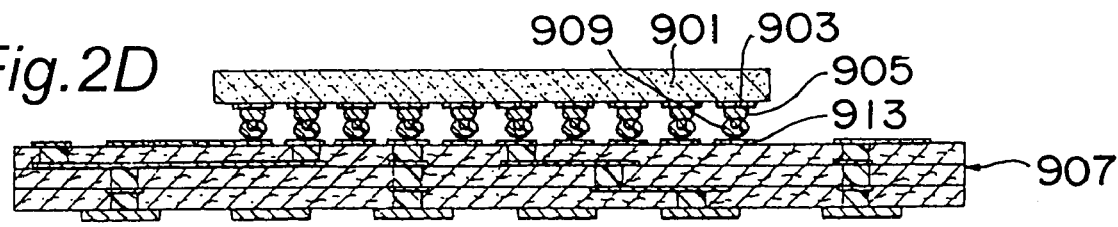
Figure 2E:
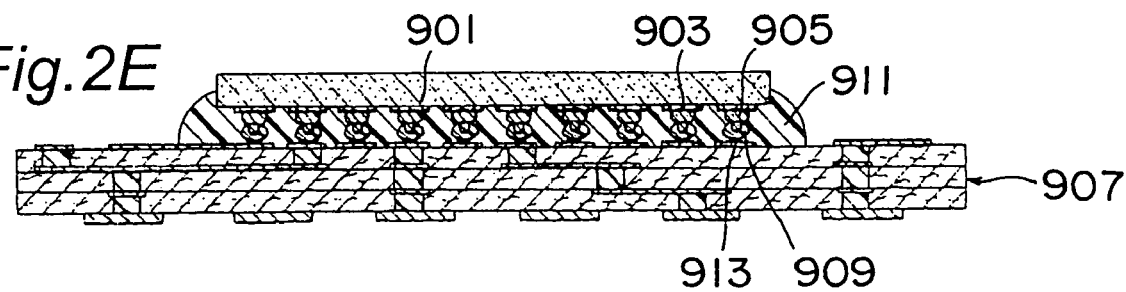

The entire disclosure of U.S. patent application Ser. No. 10/131,992, filed Apr. 25, 2002, is expressly incorporated by reference herein.

First of all, a semiconductor device according to the present invention has a semiconductor element and a circuit substrate electrically connected by using conductive paste and bumps. Furthermore, the semiconductor device according to the present invention has an intermediate connector closely adhering to the semiconductor element and the circuit substrate and provided with via holes formed according to positions of electrodes of the semiconductor element and positions of electrodes of the circuit substrate. Electrical connections between the semiconductor element and the circuit substrate are carried out by press-fitting bumps into conductive paste filled in the via hole inside. Since the conductive paste is confined in the via hole, it is possible to prevent the conductive paste to spread to adjoining electrical connections and cause shorting.

Referring now to the attached drawings, Embodiments 1 through 3 according to the present invention will be described. Like constituent elements with the same functions are given like reference characters.

Embodiment 1

Figure 3A:
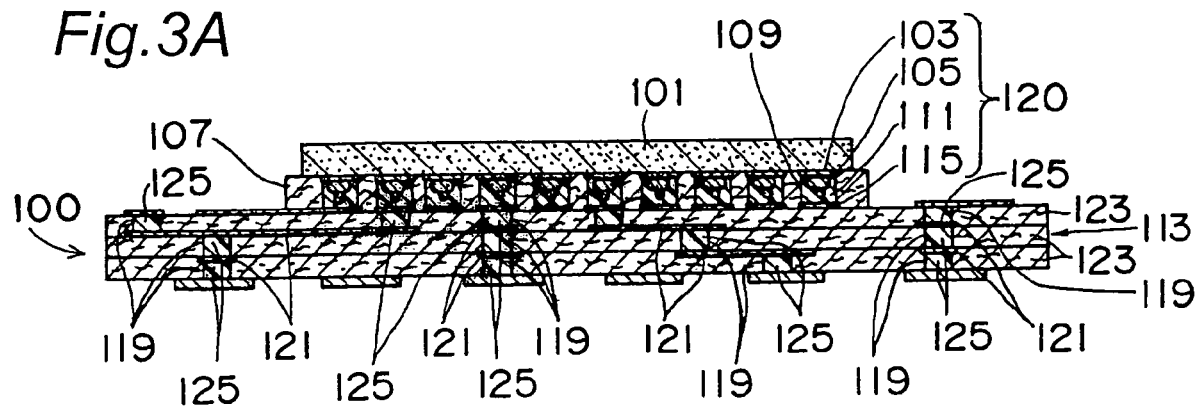
FIG. 3A is a cross-sectional view of an overall construction of a semiconductor device according to Embodiment 1.

FIG. 3A is a cross-sectional diagram showing the overall construction of semiconductor device 100 according to Embodiment 1. Semiconductor element 100 comprises semiconductor element 101, intermediate connector 107, circuit substrate 113, and a plurality of electric connections 120.

Semiconductor element 101 is an element mounted to circuit substrate 113 and is electrically and physically connected to circuit substrate 113 via each electrical connection 120.

Figure 3B:
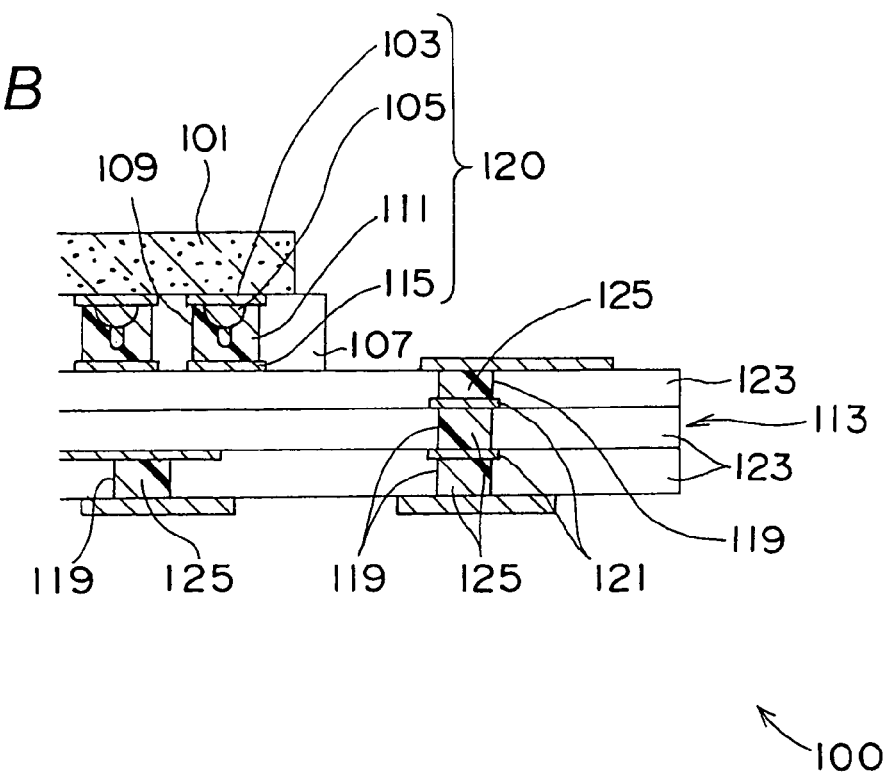
FIG. 3B is a partial enlarged view of the semiconductor device.

Circuit substrate 113 is a resin multilayer circuit substrate in which all the layers have an interstitial via hole (IVH) construction. Circuit substrate 113 has a plurality of via holes 119 at optional positions of core 123 that forms an insulation layer. FIG. 3B is a partial enlarged view of semiconductor device 100. By filling conductor 125 in via holes 119, conductivity across wiring layers 121 provided on the front surface and the rear surface of core 123, respectively, is secured. The use of a resin multilayer circuit substrate of all-layer IVH construction for circuit substrate 113 can contain wiring at still higher density. Furthermore, because the resin multilayer circuit substrate of all-layer IVH construction provides high pressure resistance, when semiconductor element 101 is mounted to circuit substrate 113 with pressure applied, the mounting yield of semiconductor element 101 can be improved.

Electric connections 120 correspond to electrode 103 as an external electrode of semiconductor element 101, bump 105 provided on electrode 103, and electrode 103, respectively, and comprises electrode 115 provided on circuit substrate 113 and conductive paste 111 that connects bump 105 and electrode 115. Electric connections 120 exist in a plurality. Corresponding electrode 103 and electrode 115 are electrically connected by the use of intermediate connectors 107 later discussed. That is, semiconductor element 101 and circuit substrate are electrically connected. By securing electrical connections between semiconductor element 101 and circuit substrate 113 by the use of bump 105 and conductive paste 111, even when stress such as thermal impact, etc. is applied to semiconductor device 100, conductive paste 111 absorbs stress concentrated to connections between semiconductor element 101 and circuit substrate 113 and prevents electrical connections from being lost. Consequently, stable electrical connections can be secured.

Intermediate connector 107 is placed between semiconductor element 101 and circuit substrate 113. Intermediate connector 107 has via holes 109 for connecting semiconductor element 101 and circuit substrate 113 at the position corresponding to electrodes 103 and electrodes 115. Inside each via hole 109, conductive paste 111 and bump 105 installed to electrode 103 are disposed in such a manner so as to be enclosed by an electrode 103 and an electrode 115. Conductive paste 111 has horizontal flowout suppressed by the wall surface of via hole 109. Thus, it is possible to prevent conductive paste 111 from spreading to adjoining electrical connections 120 and from causing shorting across adjoining electrical connections 120. Consequently, electrical connections 120 can be disposed at a narrow pitch and semiconductor element 101 and circuit substrate 113 can be connected at a high density.

Without intermediate connector 107, stress is concentrated to the portion where semiconductor element 101 and circuit substrate 113 join when temperature stress such as thermal shock is applied. However, with intermediate connector 107, such concentration of the stress can be suppressed. This is because that full surface of semiconductor element 101 is affixed to intermediate connector 107, and therefore, such concentration of the stress applying only to the joining section can be avoided. The stress is generated due to difference of thermal expansion coefficients between semiconductor element 101 and circuit substrate 113. Thus, particularly, intermediate connector 107 is preferably formed with material which has a thermal expansion coefficient between those of semiconductor element 101 and thermal expansion coefficient of circuit substrate 113. Providing this kind of intermediate connector 107 in such a manner to closely come into contact with semiconductor element 101 and circuit substrate 113 can absorb stress arising from the above-mentioned thermal expansion coefficient difference by the intermediate connector 107. Thus, the stress applied to connections between semiconductor element 101 and circuit substrate 113 can be still more reduced.

Intermediate connector 107 may be, for example, electrically insulating resin, such as bonding sheet, etc. However, it is still more preferable to use electrically insulating base material which can be compressible in the thickness direction by pressurizing and heating. This is because joining between bump 105 and conductive paste 111 and electrode 115 on circuit substrate 113 can be still more strengthened. A more specific description will be made later referring to FIG. 4F. For compressible electrically insulating base material, prepreg with uncured epoxy resin immersed in, for example, Aramid nonwoven fabric in such a manner to leave vacancies, or film base material with uncured epoxy resin impregnated in porous film base material in such a manner to leave vacancies may be used. Because this kind of compressible electrically insulating base material has vacancies in base material, the epoxy resin constituent flows by heating and pressurizing and the vacancies are filled with resin. As a result, the electrically insulating base material contracts in the thickness direction.

Referring now to FIG. 4A through 4F, a description will be made on the first manufacturing process of semiconductor device 100 (FIG. 3A).

Figure 4A:
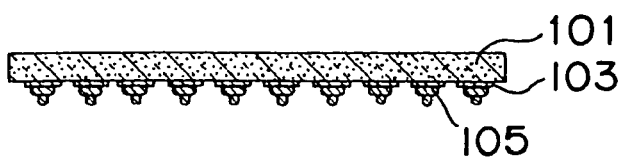
FIGS. 4A through 4F are diagrams explaining a first manufacturing process of the semiconductor device.

FIG. 4A is a diagram showing semiconductor element 101. First of all, on semiconductor element 101, one or more electrodes 103 as conductive metal layers for electrically connecting to the outside of semiconductor element 101 are formed by, for example, sputtering. The material of electrode 103 is generally same as the wiring material of semiconductor element 101, and for example, aluminum containing traces of silicon or copper. Furthermore, on the surface of an electrode 103, a conductive metal layer of various electrode materials such as nickel, copper, gold, etc. may be provided.

Then, on electrode 103 formed in this way, Au bump 105 in the form of a two-level protrusion is formed. The reason why bump 105 is not formed on electrode 115 provided in circuit substrate 113 but formed on electrode 103 is that since semiconductor element 101 provides better surface flatness than circuit substrate 113, bumps 105 with less variations can be formed, and as a result, stable electrical connections with less variations according to electrical connections 120 can be secured. The shapes and materials of bump 105 are not limited to these.

The procedure for forming bump 105 in the form of a two-level protrusion will be described as follows. First of all, a ball formed at the Au wire head end is thermally crimped and the lower level section of the two-level protrusion, that is, the level on the side in contact with electrode 103, is formed. Then, using the Au wire loop formed by moving the capillary, the upper level section (head end section) is formed. In the drawing, the bump diameter at the head end section is smaller than the bump diameter at the lower level section. Under this condition, the height of two-level protrusion bump 105 is not uniform and the flatness of the head end section lacks. Consequently, the two-level protrusion bump 105 is pressurized to uniformalize the height and flatten the head end section. In this way, bump 105 is formed on electrode 103.

Figure 4B:
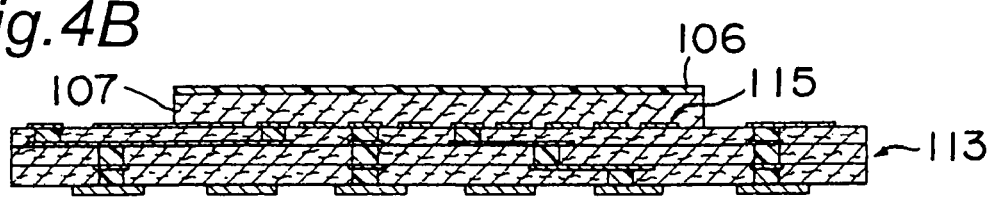

Now, FIG. 4B is a diagram showing circuit substrate 113 with intermediate connector 107 affixed. After affixing to circuit substrate 113, on the surface opposite to intermediate connector 107, cover film 106 is provided. By providing film material on one surface of intermediate connector 107 and cover film 106 on the opposite surface in advance and laminating the film base material to the desired position on circuit substrate 113, intermediate connector 107 may be affixed to circuit substrate 113. For laminating conditions, it is desirable to prevent thermosetting resin contained in intermediate connector 107 from being completely cured. This is intended to obtain satisfactory adhesion when semiconductor element 101 and intermediate connector 107 are laminated and affixed in the subsequent process.

Figure 4C:
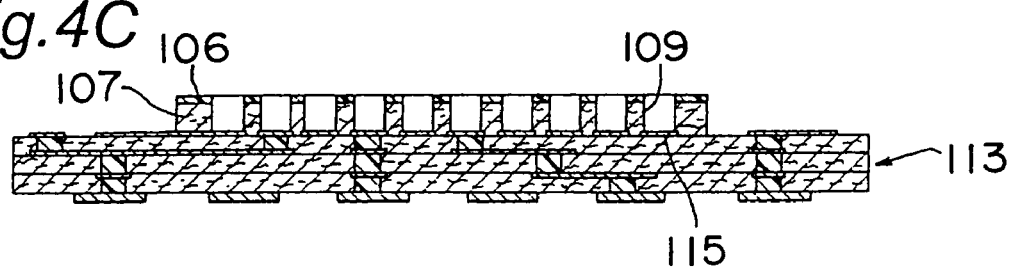

FIG. 4C is a diagram showing intermediate connector 107 with a plurality of via holes 109 formed. To be more exact, via hole 109 passes through cover film 106 and intermediate connector 107. via hole 109 is preferably formed using a laser. Laser processing is carried out until electrode 115 on circuit substrate 113 is exposed. It should be noted that via hole 109 is preferably formed with an inclination provided on its wall surface. Providing an inclination on the wall surface of via hole 109 enables easier filling of conductive paste 111 when the via hole is filled with conductive paste 111. When via hole 109 is formed using a laser, the material which has properties to absorb wavelength of the laser used for processing is used for cover film 106. In general, for example, PET film and PEN film are used.

Figure 4D:
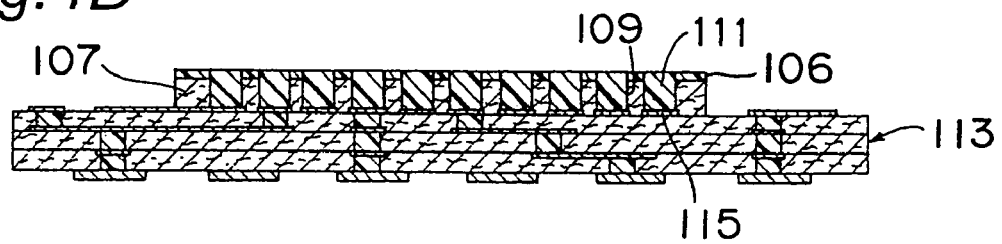
Figure 5A:
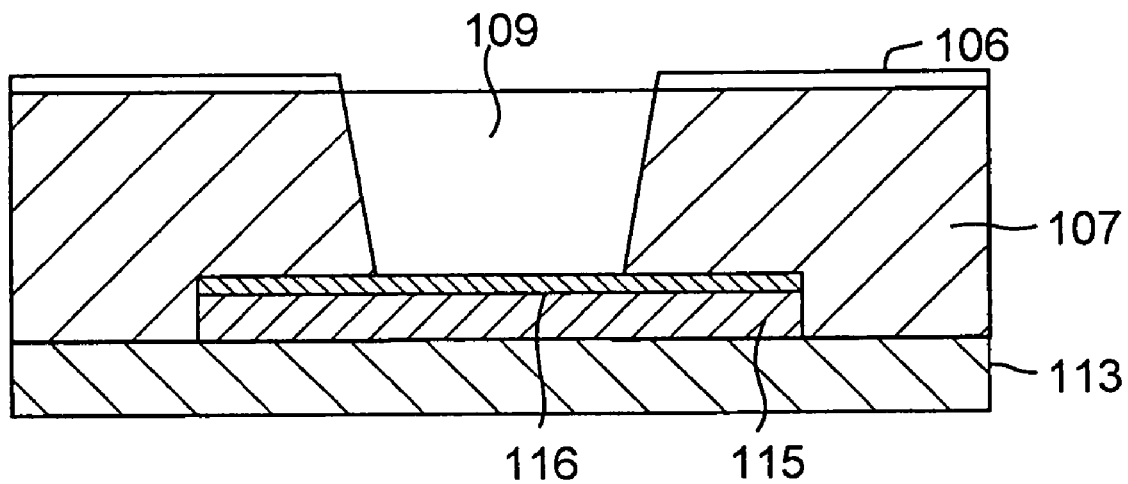
FIG. 5A is an enlarged view around the via hole formed on an intermediate connector with an inclination.

FIG. 5A is an enlarged view around via hole 109 formed with an inclination in intermediate connector 107. Because the opening diameter on cover film 106 side of via hole 109, that is, on the side to which conductive paste 111 is injected is formed to be greater than the opening diameter at the bottom of via hole 109, the wall surface of via hole 109 inclines. Thus, conductive paste 111 can be more easily filled. As clear from the drawing, via hole 109 is formed even through cover film 106. Electrode 115 formed on circuit substrate 113 is a conductive metal layer, such as a copper layer in general. In order to prevent copper surface degradation and to improve the adhesion to resin, on the conductive metal layer surface, in general, surface-treated layer 116 with coating treatment by Cr, Zn, Ni, etc., organic rust preventive film treatment, etc. provided exist. The outermost surface of surface-treated layer 116 is metal oxide coating and resin layer. However, surface-treated layer 116 arrests the contact of conductive particles in conductive paste 111 (FIG. 4D) filled in via hole 109 with the conductive metal layer. Consequently, at the bottom of via hole 109, electrical connections are hampered. That is, trade-off exists in that surface-treated layer 116 is necessary from the viewpoint of preventing surface degradation and securing adhesion of conductive metal layer, electrode 115, but is not desirable from the viewpoint of electrical connections at the bottom of via hole 109.

Figure 5B:
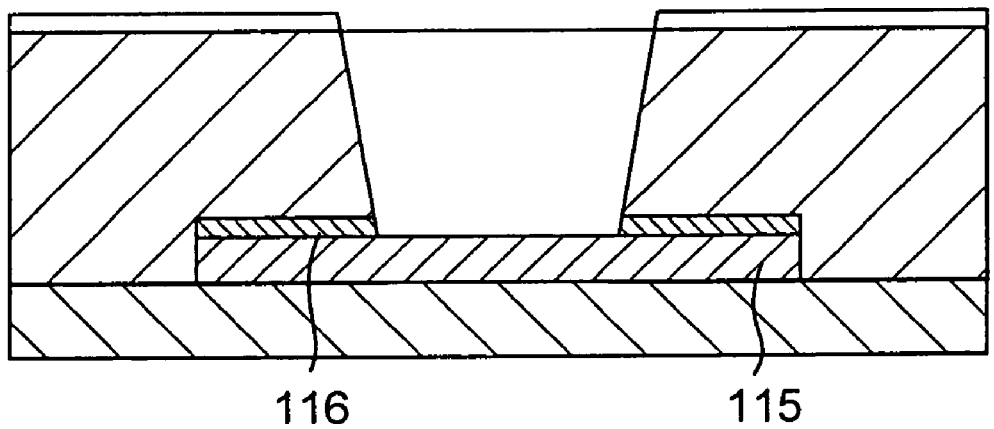
FIG. 5B is a cross-sectional view after removing an exposed section in the via hole of the surface-treated layer.

In the present embodiment, surface-treated layer 116 is removed when via hole 109 is formed. This is because surface degradation, etc. of electrode 115 does not occur after the conductive paste is filled in via hole 109 even if surface-treated layer 116 is removed. Thus, the conductive particles in the conductive paste can be securely brought in contact with the conductive metal layer. Surface-treated layer 116 is removed by chemicals, ion milling or dry etching under vacuum, oxide film removal in the reducing atmosphere, blasting in the inert atmosphere such as nitrogen, argon, etc., or other physical processing. Because surface-treated layer 116 is removed by melting, etc. in this way, electrical connections can be secured while it is no longer necessary to form surface-treated layer 116 as thin as possible as is the case of conventional ones and manufacturing becomes easy. FIG. 5B is a diagram showing the removal result of the surface treated layer 116 portion exposed in via hole 109. Thus, it is understood that electrode 115 is exposed in via hole 109.

Note that, when via hole 109 is formed using a laser, surface-treated layer 116 may be removed as soon as via hole 109 is formed by controlling laser energy, pulse width, shot number, etc. Or, with the heat generated at laser processing, surface-treated layer 116 may be diffused inside the conductive metal layer and the ratio of metal material (e.g. copper) exposed may be increased on the bottom of via hole 109. By these techniques, electrical connections between conductive paste and electrode 115 can be securely achieved.

By removing the surface-treated layer present on the surface of electrode 115 as described above, the conductive metal layer of electrode 115 can be exposed at electrical connection 120 (FIG. 3B) only of wiring and electrodes on circuit substrate 113. Consequently, the above-mentioned trade-off can be solved.

During laser processing, the position of intermediate connector 107 to which the laser is irradiated should be determined by the use of the measured value of the position of electrode 115. This is because circuit substrate 113 with electrode 115 formed includes the organic resin and is likely to cause dimensional changes due to heat and pressure in the manufacturing process so as to put out errors for dimension of patterns of designed circuit substrate 113.

The measured value of electrode 115 can be obtained by measuring the position of reference point of circuit substrate 113 as viewed, for example, from the top of the circuit substrate 113. For the reference point, a marker provided in advance in circuit substrate 113 for position measurement may be used or reference electrode 115 is set and the edge may be used. The displacement on the plane coordinates between the reference point measured in this way and the design reference point of circuit substrate 113 is reflected to the design processing position data entered in advance to correct the processing position data. By laser processing based on the corrected processing position data, via hole 109 can be formed highly accurately at the position of intermediate connector 107 corresponding to electrode 115. If it is possible to think that there is no displacement, the laser irradiation position may be determined using the design value.

Furthermore, in the similar manner, measuring the position of bump 105 provided at semiconductor element 101 and reflecting the position data to the processing position data for correction can form via hole 109 more highly accurately. Because Thus correction, via hole 109 can be exactly formed according to the position of bump 105 and electrode 115, the alignment allowance for aligning can be set to be small. Consequently, semiconductor device 100 (FIG. 3A) with electric connections 120 (FIG. 3B) disposed at a still narrower pitch can be achieved. Furthermore, measuring positions of both electrode 115 and bump 105 enables the determination of semiconductor element 101 which is originally not allowed to position bump 105 to electrode 115. Consequently, the yield can be further improved. In addition, since this judgment is made before semiconductor element 101 is mounted to circuit substrate 113, semiconductor element 101 which is judged unable to be mounted can be reused for a semiconductor element to be mounted to another circuit substrate 113.

Then, FIG. 4D is a diagram showing via hole 109 after conductive paste 111 is filled. Conductive paste 111 includes thermosetting resin and conductive particles. Thermosetting resin is, for example, phenol and epoxy, and functions as a binder. Conductive particles preferably comprise at least one of gold, silver, copper, silver palladium, and these alloys and are dispersed in the thermosetting resin. Conductive particles have less degraded layer such as oxidation, etc. that interferes with joining on the surface and achieve highly reliable electric connection. Note that, cover film 106 has a role of protection for preventing conductive paste 111 from adhering to the surface of intermediate connector 107 in the paste filling process.

Figure 4E:
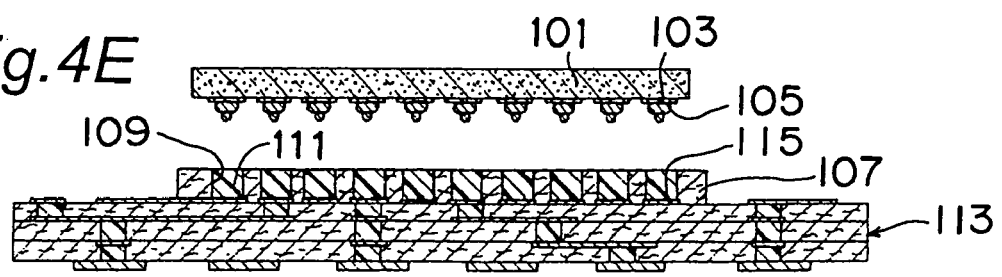

FIG. 4E is a diagram showing circuit substrate 113 after aligning the position to semiconductor element 101. By the alignment, semiconductor element 101 can be built by laminating to intermediate connector 107. In alignment, cover film 106 (FIG. 4C) can be peeled off. When cover film 106 is peeled off, conductive paste 111 tends to protrude from the surface of intermediate connector 107 as much as the thickness of cover film 106. This protruded conductive paste 111 has a fear of inducing shorting across adjoining electric sections 120 when semiconductor element 101 is laminated to intermediate connector 107. Consequently, the protruded section should be reduced as much as possible, and to achieve this, cover film 106 as thin as possible to the limit that would not break during handling should be used.

Peeling off cover film 106 can prevent processing chips during laser processing from adhering to the surface of intermediate connector 107.

It is preferable to scrape away conductive paste 111 filled to the surface of cover film 106 by a soft squeegee such as rubber, etc. after filling conductive paste 111 into via hole 109 and to fill conductive paste 111 in a concave form with care to prevent conductive paste 111 from coming in contact with cover film 106, in addition to reducing the thickness of cover film 106.

When conductive paste 111 is filled by filling squeegee printing, conductive paste is densely filled from the via hole bottom to the surface (opening section) and then, a specified volume of conductive paste is scraped away from the via hole opening section. By setting squeegee hardness, squeegee angle, and squeegee travel speed at each process, stable filling and scraping of conductive paste can be successfully achieved.

It is also allowed to fill via hole 9 with conductive paste 111 by a dispense method. The "dispense method" is a method for discharging a specified volume of conductive paste 111 from a container containing conductive paste 111 by external force such as air pressure, etc. By using the dispense method, each via hole 109 can be filled with conductive paste 111 with less variations and at the same time, the pressure at the time of discharge can be optionally set and minute via hole 109 can be filled with conductive paste 111 at high density by setting high discharge pressure. In addition, using the dispense method and the scrape-away process by a squeegee in combination can further suppress variations of the filling volume.

The volume of conductive paste 111 filled in via hole 109 is preferably set to the value greater than the one obtained from subtracting the volume of bump 105 from the volume of via hole 109 and smaller than the volume of via hole 109. Setting the volume of conductive paste 111 filled in via hole 109 to this range can compress and densify conductive paste 111 while suppressing stick-out of conductive paste 111 from via hole 109 when bump 105 is buried in conductive paste 111 in the subsequent process.

Figure 4F:
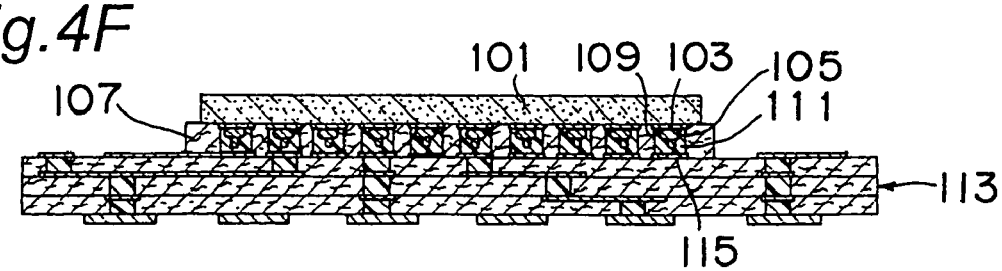

FIG. 4F is a diagram showing circuit substrate 113 with semiconductor element 101 laminated. Bump 105 is buried in conductive paste 111 in via hole 109 and semiconductor element 101 is laminated on intermediate connector 107. By heating and pressurizing thereafter, electrical connections can be secured between bump 105, conductive paste 111, and electrode 115 on circuit substrate 113.

Forming an inclination on the wall surface of via hole 109 allows the wall surface of via hole 109 to serve as a guide for guiding bump 105 at the time of heating and pressurizing. Consequently, even if the lamination position slightly deviates, bump 105 would not come off from electrode 115 on circuit substrate 113 as a result. In addition, because heating and pressurizing with bump 105 buried inside via hole 109, displacement between semiconductor/elment 101 and circuit substrate 113 can be suppressed.

When bump 105 is buried in conductive paste 111 in via hole 109, bump 105 has a wider surface in contact with conductive paste 111 and electrical connection becomes more stabilized. Furthermore, a construction difficult to degrade connections between bump 105 and conductive paste 111 is achieved even when stress is concentrated to the connections, which is preferable. This is particularly conspicuous when bump 105 has a higher two-level protruding form than when the height is of one level. Furthermore, by heating and pressurizing in such occasion, conductive paste 111 may be compressed with bump 105 and conductive particles in conductive paste 111 may be densified. Thus, electrical connections are still more stabilized between bump 105 and conductive paste 111 and electrode 115 on circuit substrate 113, which is preferable.

When conductive paste 111 is densified by heating and pressurizing, it is preferable to densify while sealing the opening section of via hole 109 with a care to prevent conductive particles contained in conductive paste 111 from flowing out in the plane direction, that is, in the spreading direction of semiconductor element 101. That is, to densify conductive paste 111 by compressive force, a clearance that allows the resin components contained in conductive paste 111 to flow out from the sealed section but conductive particles do not flow out is provided at the interface between intermediate connector 107 and semiconductor element 101 or at the interface between intermediate connector 107 and circuit substrate 113.

The clearance provided at the interface between intermediate connector 107 and semiconductor element 101 can be formed by coarsening the uncured resin surface exposed to the surface of intermediate connector 107 and setting the surface roughness to the particle size or smaller of conductive particles contained in conductive paste 111. On the other hand, for the clearance provided at the interface between intermediate connector 107 and circuit substrate 113, it would be much more convenient to coarsen the surface of electrode 115 formed on the surface of circuit substrate 113 in advance and provide a desired clearance at the interface with intermediate connector 107. In addition, the same effects can be obtained when porous material containing vacancies inside is used for intermediate connector 107 and resin components contained in conductive paste 111 only are allowed to flow out in intermediate connector 107.

Intermediate connector 107 disposed on circuit substrate 113 without completely curing the thermosetting resin in the process shown in FIG. 4B contracts in the thickness direction and compresses conductive paste 111 more and at the same time completely cures in the heating and pressurizing process after burying bump 105 in conductive paste 111 in the process of FIG. 4F. Thus, joining between bump 105, conductive paste 111, and electrode 115 on circuit substrate 113 can be still more strengthened. Consequently, semiconductor element 101 and intermediate connector 107 are still more strongly affixed and Thus strong adhesion, exfoliation of semiconductor element 101 from circuit substrate 113 is suppressed. It is more preferable to set the curing ratio of thermosetting resin of intermediate connector 107 to 50% or less under the conditions shown in FIG. 4B from the viewpoint of securing the adhesion with semiconductor element 101 in the heating and pressurizing process shown in FIG. 4F. The curing ratio can be controlled according to temperature and time.

By the process described above, it is possible to obtain semiconductor device 100 (FIG. 3A) according to embodiment 1. In FIG. 4A, it was described that bump 105 has the bump diameter at the head end section is smaller than the bump diameter at the lower end section. However, the bump diameter at the head end section may be greater than the bump diameter at the lower level section. Using the bump with the bump diameter greater at the head end section, it is possible to heighten the anchoring effects between conductive paste 111 and bump 105. Consequently, even when pulling force in the vertical direction is applied across semiconductor element 101 and circuit substrate 113, bonding between bump 105 and conductive paste 111 can be maintained. A procedure for forming this kind of bump will be described referring to FIG. 6A through 6E.

Figure 6A:
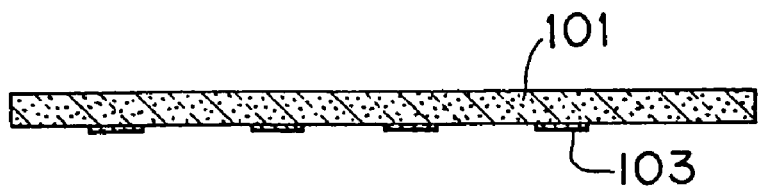
FIGS. 6A through 6E are diagrams of a procedure for forming bumps with a diameter greater than a lower level section.

FIG. 6A through 6E are diagrams showing a procedure for forming bump 105 with a bump diameter greater than the lower level section. Here, a bump of a type different from the two-level protrusion will be described. FIG. 6A is a diagram showing semiconductor element 101. First of all, on semiconductor element 101, electrode 103 is formed for electrically connecting to the outside of semiconductor element 101.

Figure 6B:
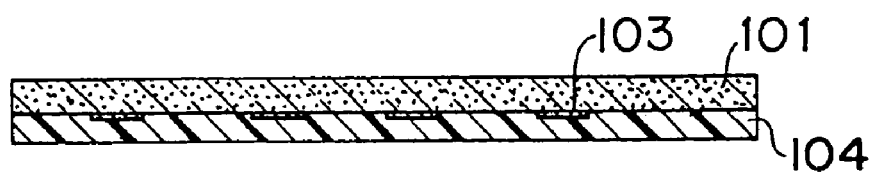

FIG. 6B shows semiconductor element 101 with photo resist 104 applied. Photo resist 104 is applied to the surface of semiconductor element 101 on which electrode 103 is formed. Photo resist 104 may be of a negative or a positive type.

Figure 6C:
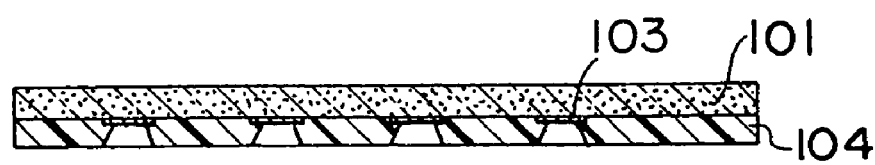

FIG. 6C shows photo resist 104 with a pattern exposed to the light in a tapered form. This kind of pattern is obtained by exposing the pattern to photo resist 104 using a photo mask and developing thereafter. To achieve a tapered form, appropriate exposure and developing conditions should be set. For example, when the negative type is used for photo resist 104, the exposure and developing conditions should be set to achieve over-exposure. Thus, a pattern of a tapered form can be formed easily on photo resist 104.

Figure 6D:
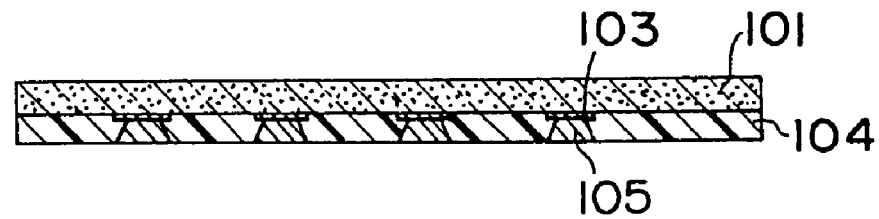

Next, FIG. 6D shows metal 105 formed by plating. Metal 105 is the bump base material, that is, bump 105 itself. Metal 105 can be obtained by allowing exposed electrode 103 to deposit by plating. Bump 105 can be flattened by carrying out deposition with care to prevent metal deposition material from protruding from the surface of photo resist 104. It is desirable to use gold, silver, copper, and alloys of these for the metal deposition material by plating from the viewpoint of more stable joining with conductive paste 111 (FIG. 3A).

Figure 6E:
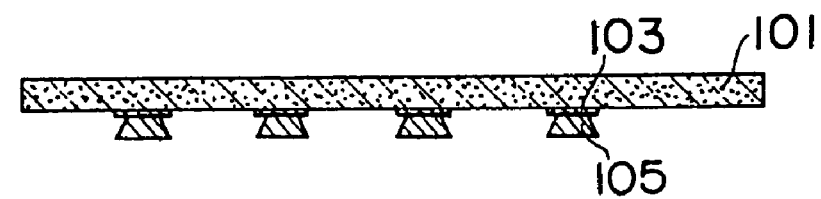

Lastly, FIG. 6E is a diagram showing semiconductor element 101 with bump 105 of a larger bump diameter at the head end section. Bump 105 can be obtained by removing photo resist 104 at semiconductor element 101 of FIG. 6D.

Figure 7:
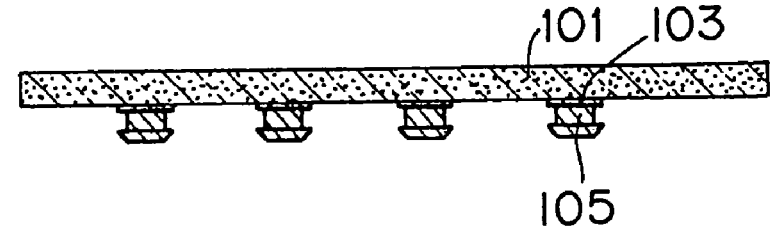
FIG. 7 is a diagram of a semiconductor with mushroom-form bumps.

In FIG. 6D, metal may be deposited in such a manner that the metal material protrudes on the surface of photo resist 104. By allowing metal to be deposited in such a manner that the metal material protrudes, bump 105 takes a mushroom form. FIG. 7 is a diagram showing semiconductor element 101 where mushroom-form bump 105 is formed. By bump 105 being of a mushroom form, anchoring effects between conductive paste 111 and bump 105 are further improved and still more satisfactory connection stability can be secured.

In addition, for intermediate connector 107, the base material of 3-layer construction with adhesive layers provided on both surfaces of the film base material may be used. When semiconductor element 101 is laminated on intermediate connector 107, the film base material that serves the core of intermediate connector 107 can maintain its profile. Consequently, the wall surface of via hole 109 suppresses the spread of conductive paste 111, compressive force is applied to conductive paste 111, and the bond between bump 105 and conductive paste 111 and electrode 115 can be further strengthened. The adhesive layers provided on both surfaces of the film material affix intermediate connector 107 to semiconductor element 101 and circuit substrate 113, respectively. Furthermore, since the adhesive layers contract in the thickness direction by pressurization and heating when semiconductor element 101 is laminated to intermediate connector 107, conductive paste 111 can be still more densified.

When the 3-layer construction film base material is used for intermediate connector 107, there exist still another advantage. That is, the thickness of intermediate connector 107 can be reduced. When electric connections 120 are disposed at a still narrower pitch, the diameter of via hole 109 must be further reduced. In such event, reducing the diameter of via hole 109 alone causes the aspect ratio of the diameter to the depth of via hole 109 increases. On the other hand, when via hole 109 is filled with conductive paste 111, it is desirable that the aspect ratio is smaller. This is because conductive paste 111 can be filled stably. Consequently, if intermediate connector 107 is formed by the use of film base material, the thickness can be reduced and the increase of the aspect ratio can be prevented. Furthermore, electrical connections 120 can be disposed at a narrow pitch. Specifically, when intermediate connector 107 is formed by the use of film base material and via hole 109 is made smaller, the thickness of film base material becomes super-thin as 50 μm or less.

Figure 8A:
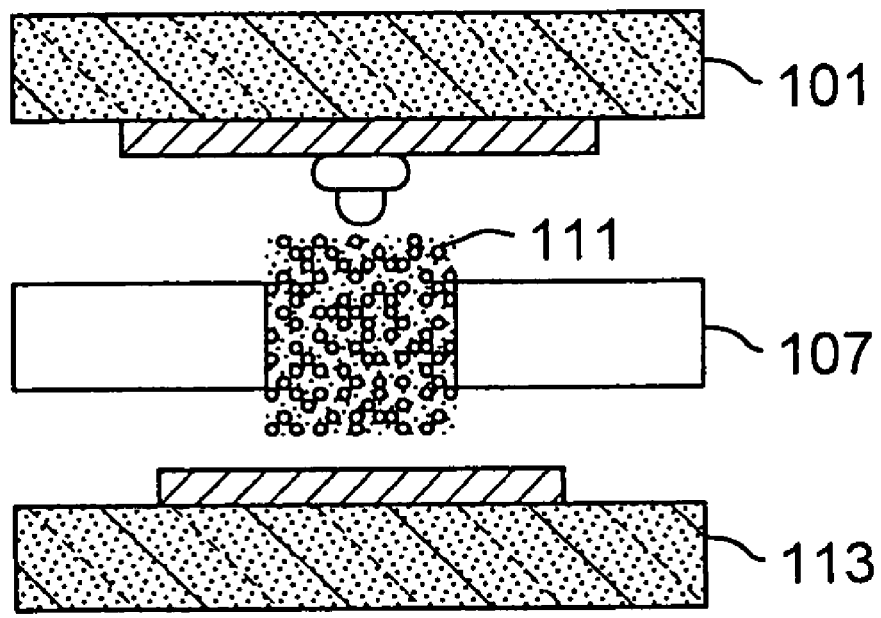
FIG. 8A is a diagram of an intermediate connector with conductive paste filled into via holes before bonding the semiconductor element to the circuit substrate.
Figure 8B:
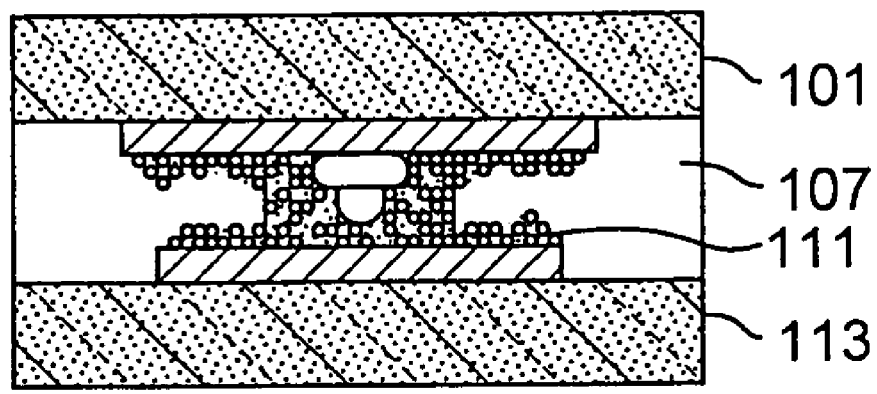
FIG. 8B is a diagram of the intermediate connector after the semiconductor element and the circuit substrate are bonded.

When the film base material becomes as thin as this level, it is difficult to handle intermediate connector 107 independently. For example, if intermediate connector 107 has a certain thickness, it is not necessary to place intermediate connector 107 in advance on circuit substrate 113 in FIG. 4B. That is, it is possible to laminate and affix semiconductor element 101 and circuit substrate 113 after forming a via hole in intermediate connector 107 and is filled with conductive paste 111. However, when intermediate connector 107 is extremely thin, this process cannot be adopted. FIG. 8A is a diagram showing intermediate connector 107 with the via hole filled with conductive paste 111 before affixing semiconductor element 101 to circuit substrate. Since intermediate connector 107 is thin, conductive paste 111 protrudes from both ends of the via hole provided to the intermediate connector 107. When semiconductor element 101 is affixed to circuit substrate 113 by the use of this kind of intermediate connector 107, protruded conductive paste 111 is spread in the plane direction in heating and pressurizing process. FIG. 8B is a diagram showing intermediate connector 107 after semiconductor element 101 and circuit substrate 113 are affixed. Thus configuration, electric shorting occurs at adjoining connections when the pitch between via hole (connections) is made narrower.

Figure 9A:
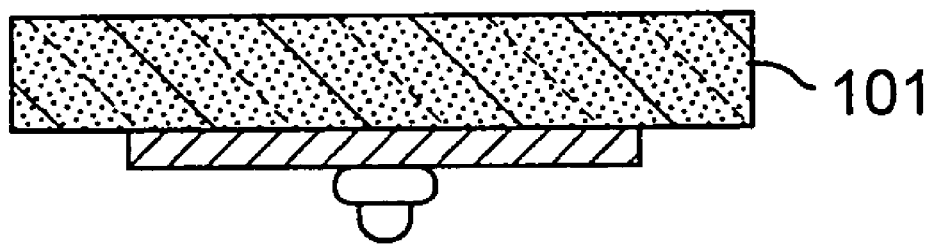
FIG. 9A is a diagram of the intermediate connector with conductive paste filled into via holes before bonding to semiconductor element after the circuit substrate is bonded.
Figure 9A:
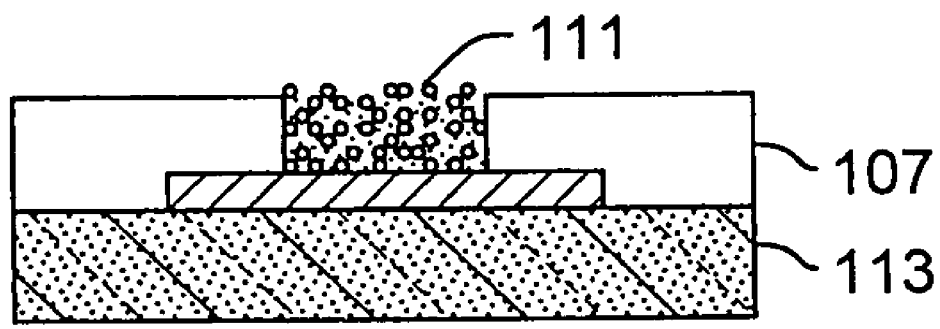
Figure 9B:
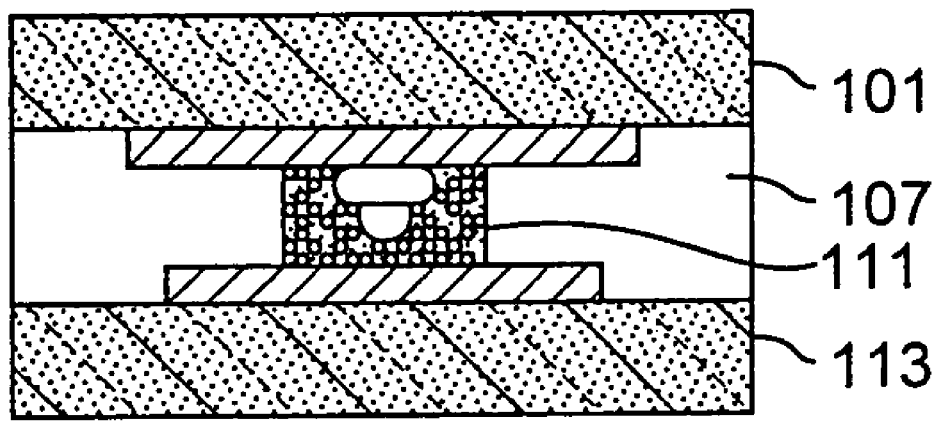
FIG. 9B is a diagram of the intermediate connector after bonding the circuit substrate to the semiconductor element.

Consequently, the process for forming intermediate connector 107 in advance on circuit substrate 113 as described above is desirable. According to this process, the opening surface of the via hole for which conductive paste protrusion must be suppressed is in one direction, and can be easily controlled in the scarping process when conductive paste 111 is filled. FIG. 9A is a diagram showing intermediate connector 107 with conductive paste 111 filled into via hole 109 before the intermediate connector is affixed to semiconductor element 101 after it is affixed to circuit substrate 113. It is understood that by controlling the volume of conductive paste 111 in the process to fill conductive paste 111, no conductive paste 111 is protruded from the surface of intermediate conductor 107. Thus, it is possible to suppress the spread of conductive paste 111 in the plane direction at both end faces of the via hole in the heating and pressurizing process. FIG. 9B is a diagram showing intermediate connector 107 after circuit substrate 113 is affixed to semiconductor element 101. Thus, even when the connections are disposed at a further narrower pitch, electrical shorting can be prevented. In addition, conductive paste 111 can be retained without leak as one side of via hole 109 (i.e. circuit substrate 113 side) closes. Therefore, only one control such as scraping at the time of filling conductive paste 111 is required, and the manufacturing process can be simplified.

In the present embodiment, for circuit substrate 113, description is made by using the resin multilayer circuit substrate of total-layer IVH construction. However, the construction of circuit substrate 113 is not restricted to this. The same effects are obtained even by using, for example, glass epoxy substrate and buildup substrate for circuit substrate 113.

Referring now to FIG. 10A through 10F, the second manufacturing method of semiconductor device 100 (FIG. 3A) according to embodiment 1 will be described. If the description overlaps the description made referring to FIG. 4A through 4F, the detailed description will be omitted.

Figure 10A:
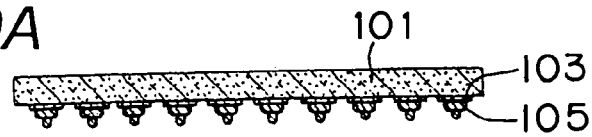
FIGS. 10A through 10F are diagrams explaining a second manufacturing process of the semiconductor device according to Embodiment 1.

FIG. 10A is a diagram showing semiconductor 101 and is the same as FIG. 4A. On semiconductor element 101, electrode 103 is formed, further on which 2-level protrusion form bump 105 is formed.

Figure 10B:
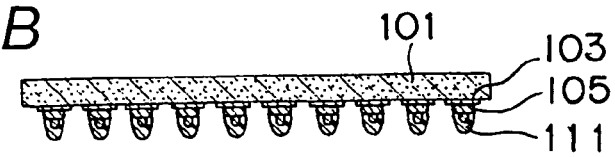

FIG. 10B is a diagram showing conductive paste 111 with conductive paste 111 transferred to the head end of bump 105. As clear from this, conductive paste 111 is not directly filled into via hole 109 of intermediate connector 107 as shown in FIG. 4D.

Figure 10C:
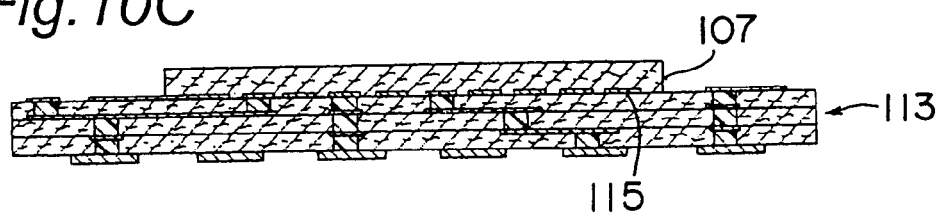

Then, FIG. 10C is a diagram showing circuit substrate 113 with intermediate connector 107 affixed to the surface. Needless to say, when intermediate connector 107 is affixed, same as FIG. 4B, intermediate connector 107 is not completely cured.

Figure 10D:
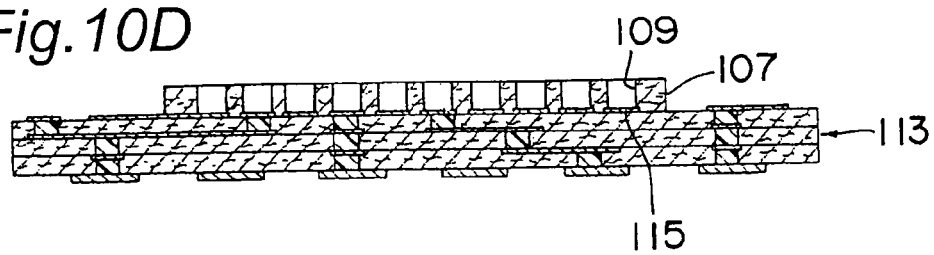

FIG. 10D is a diagram showing intermediate connector 107 with a plurality of via holes 109 formed. This is same as FIG. 4C. Note that, in FIG. 10D, there described is an example when cover film 106 (FIG. 4B, FIG. 4C) is not formed on the surface of intermediate connector 107. However, if cover film 106 is formed on the surface of intermediate connector 107 and is peeled off after via hole 109 is laser-processed, processing chips during laser processing can be prevented from affixing to the surface of intermediate connector 107.

Figure 10E:
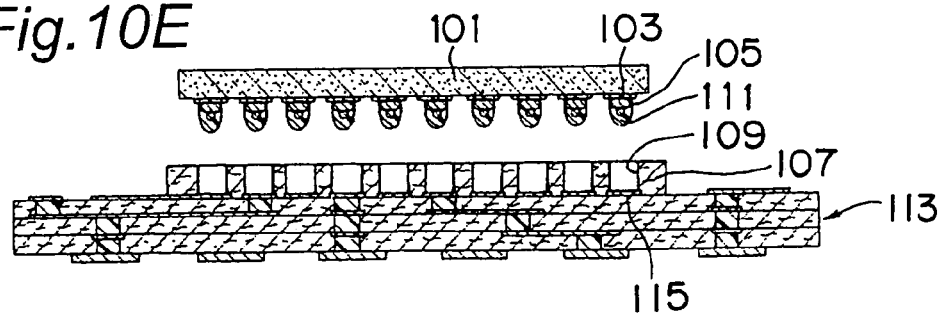

FIG. 10E is a diagram showing circuit substrate 113 after aligning the position to semiconductor element 101. In order to laminate and dispose semiconductor element 101 to intermediate connector 107, bump 105 with conductive paste 111 provided and via hole 109 are positioned.

Figure 10F:
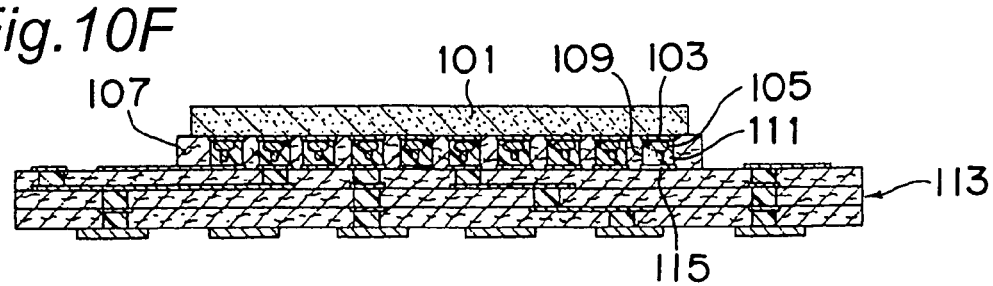

Lastly, FIG. 10F is a diagram showing circuit substrate 113 with semiconductor element 101 laminated. Bump 105 and conductive paste 111 are accommodated in via hole 109 and paste 111 is cured by heating and pressurizing. Making the best of this heating and pressurizing, conductive paste 111 is compressed by bump 105 and conductive particles in conductive paste 111 may be densified. Thus, electrical connections between bump 105 and conductive paste 111 and electrode 115 on circuit substrate 113 are further stabilized and are desirable. By the above-mentioned second manufacturing method, semiconductor device 100 is completed.

Even in the second manufacturing method, same as the first manufacturing method, when conductive paste 111 is sealed into though hole 109, a clearance that prevents conductive particles contained in conductive paste 111 from flowing out but that allows resin component only to flow out may be formed. The clearance may be formed at the interface between intermediate connector 107 and semiconductor element 101, or at the interface between intermediate connector 107 and circuit substrate 113. Thus, the conductive paste can be densified in the heating and pressurizing process and at the same time, electrical shorting with adjoining connections can be suppressed.

As described above, semiconductor device 100 (FIG. 3A) according to embodiment 1 has intermediate connector 107 equipped with via hole 109 located at the positions corresponding to electrode 105 of semiconductor element 101 and electrode 115 of circuit substrate 113 between the semiconductor element 101 and circuit substrate 113. Electrical connections between electrode 103 and electrode 115 are achieved by burying bump 105 formed on electrode 103 into conductive paste 111 filled into via hole 109. Because conductive paste 111 is sealed inside via hole 109, it is possible to prevent conductive paste 111 from being spread to adjoining electric connections 120 and from causing shorting of adjoining electric connections 120. Consequently, electric connections 120 can be provided at a still narrower pitch.

In addition, via hole 109 is formed after reflecting the measured value of the position of electrode 115 in circuit substrate 113 and the measured value of the position of bump 105 in semiconductor element 101 to the design processing data for processing and correcting the processing data. Consequently, via hole 109 can be formed at a higher accuracy and the packaging yield can be improved. Furthermore, electric connections 120 can be disposed at a still narrower pitch.

In addition, because semiconductor device 100 (FIG. 3A) has bump 105 buried in conductive paste 111 in via hole 109, even when shearing force in the horizontal direction (plane direction) is applied across semiconductor element 101 and circuit substrate 113, bump 105 does not come off from conductive paste 111 and electrical connections can be stably maintained. In addition, according to the first and the second manufacturing methods of the semiconductor device by embodiment 1, processing of via hole 109, filling of conductive paste 111, and heating and pressurizing can be carried out en bloc. Consequently, a plurality of semiconductor elements can be mounted on a large-sized circuit substrate en bloc and excellent productivity can be achieved.

Embodiment 2

Figure 11A:
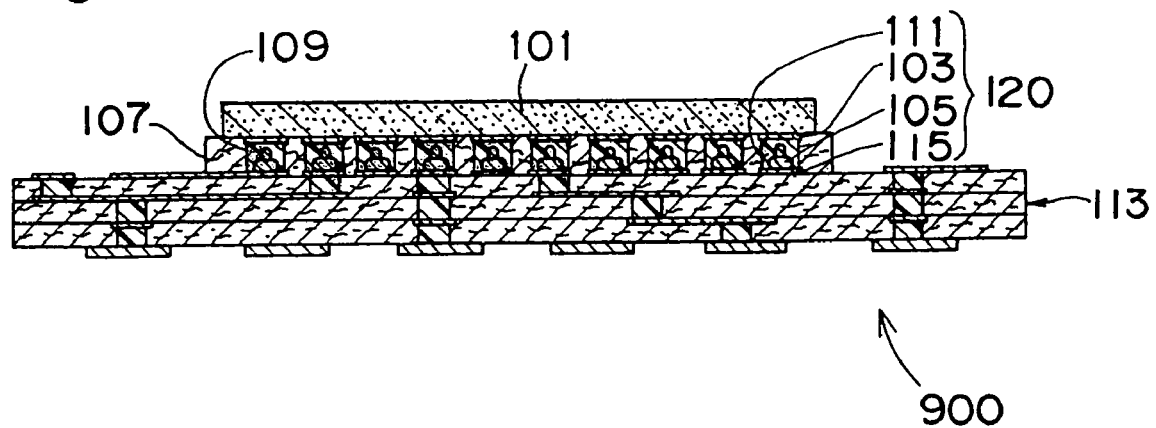
FIG. 11A is a cross-sectional view of a construction of a semiconductor device according to Embodiment 2.
Figure 11B:
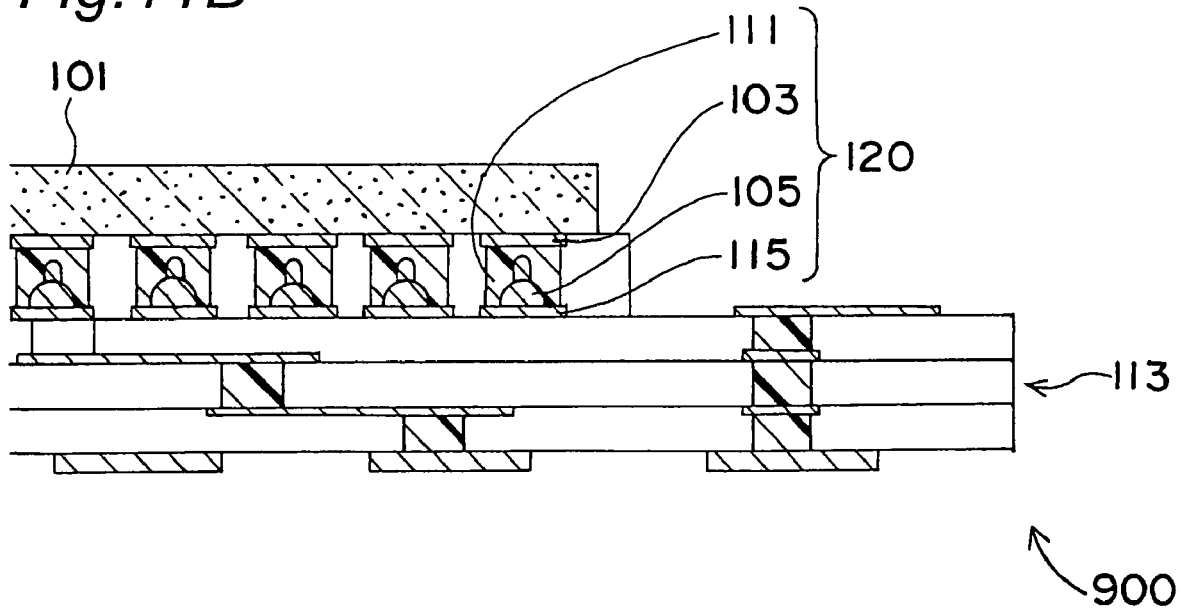
FIG. 11B is a partial enlarged view of the semiconductor device.

FIG. 11A is a cross-sectional view showing the construction of semiconductor device 900 according to embodiment 2. FIG. 11B is a partial enlarged view of semiconductor device 900. In embodiment 1, on electrode 103 of semiconductor element 101 (FIG. 3B), bump 105 is provided. Semiconductor device 900 according to the present embodiment has bump 105 provided on electrode 115 of circuit substrate 113. Other configurations, for example, that electrode 103 on semiconductor element 101 and electrode 115 on circuit substrate 113 are electrically connected via bump 105 and conductive paste 111 and that the wall surface of via hole 109 suppresses the flowout of conductive paste 111 and prevents defective shorting across adjoining electrical connections 120, are same as embodiment 1.

Figure 12A:
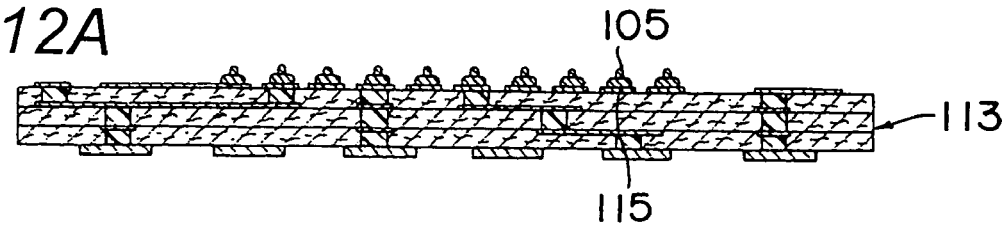
FIGS. 12A through 12F are diagrams explaining a manufacturing process of the semiconductor device according to Embodiment 2.

Referring now to FIG. 12A through 12F, the manufacturing process of semiconductor device 900 (FIG. 11A) according to embodiment 2 is described. First of all, FIG. 12A is a diagram showing circuit substrate 113. On circuit substrate 113, electrode 115 for electrically connecting to semiconductor 101 is formed. Furthermore, bump 105 is formed on electrode 115. In embodiment 2, the two-level protrusion form bump is used for bump 115. Same as embodiment 1, the bump 105 form is not limited to this.

Figure 12B:
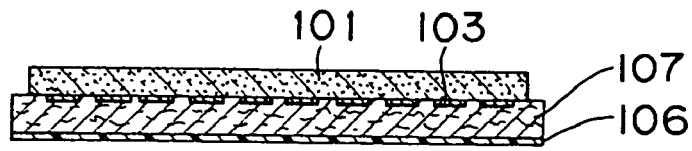

Next, FIG. 12B is a diagram showing semiconductor element 101 with intermediate connector 107 affixed. On the surface of intermediate connector 107, cover film 106 is formed. In the process for affixing intermediate connector 107, it is desirable not to completely cure thermosetting resin contained in intermediate connector 107.

Figure 12C:
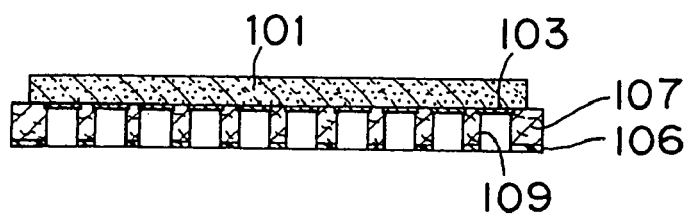

Furthermore, FIG. 12C is a diagram showing intermediate connector 107 with via hole 109 formed. To be more exact, via hole 109 passes through cover film 106 and intermediate connector 107. via hole 109.passes through cover film 106 and intermediate connector 107. It is desirable to form via hole 109 using laser. Laser processing is carried out until electrode 103 on semiconductor element 101 is exposed. When via hole 109 is formed using laser processing, the measured value of bump 105 provided on circuit substrate 113 and the measured value of electrode 103 provided on semiconductor element 101 are reflected to the design processing data and the processing data is corrected. And it is desirable to process via hole 109 thereafter.

Figure 12D:
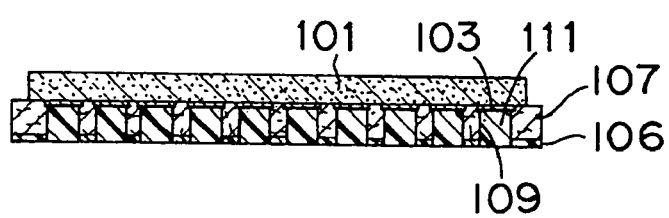

FIG. 12D is a diagram showing via hole 109 with conductive paste 111 filled. The technique for filling a desired volume of conductive paste 111 is same as that described in embodiment 1.

Figure 12E:
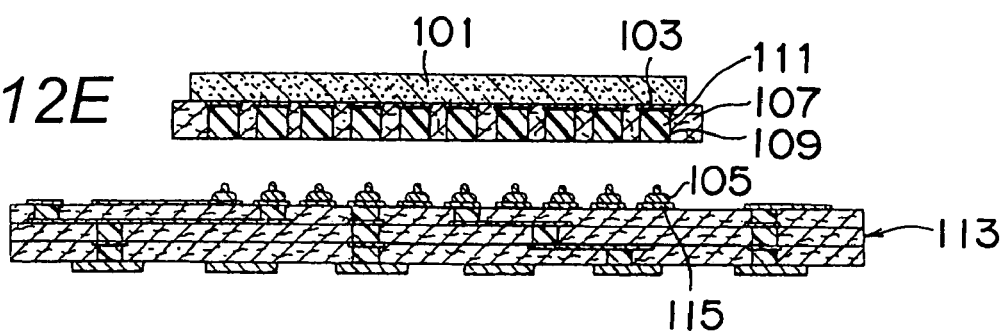

Next, FIG. 12E is a diagram showing circuit substrate 113 after aligning the position to semiconductor element 101. The positions of bump 105 with conductive paste 111 provided and via hole 109 are aligned for laminating and disposing semiconductor element 101 to intermediate connector 107. In this process, cover film 106 is peeled off from intermediate connector 107.

Figure 12F:
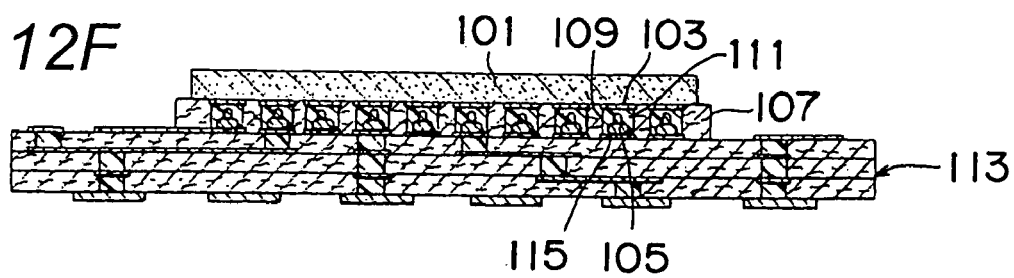

FIG. 12F is a diagram showing circuit substrate 113 with semiconductor element 101 laminated. Bump 105 is buried in conductive paste 111 inside via hole 109 by heating and pressurizing and at the same time, intermediate connector 107 is affixed to circuit substrate 113. Thus, electrical connections between bump 105, conductive paste 111, and electrode 103 of semiconductor element 101 are secured. Furthermore, by heating and pressurizing in such event, conductive paste 111 may be compressed by bump 105. Thus, conductive particles inside conductive paste 111 are densified and still more stable electrical connections are achieved between bump 105, conductive paste 111, and electrode 103 of semiconductor element 101. In this way, by the above-mentioned manufacturing method, semiconductor device 900 is completed.

Semiconductor device 900 (FIG. 11A) of the present embodiment differs from semiconductor 100 (FIG. 3A) of embodiment 1 in that bump 105 is formed on electrode 115 of circuit substrate 113. In general, electrode 115 formed in circuit substrate 113 is frequently formed by the use of conductive metal layer or copper plating, and the thickness ranges 18 μm to 35 μm. This is frequently thicker than electrode 103 formed on the side of semiconductor element 101. Consequently, in the lamination and affixing process by heating and pressurizing shown in FIG. 12F, laminating and disposing intermediate connector 107 in circuit substrate 113 in such a manner that electrode 115 is buried in via hole 109 can compress and densify conductive paste 111 further more.

Note that, in the present embodiment, bump 105 is formed only on the side of circuit substrate 113. Forming bump 105 also on the side of semiconductor element 101 achieves still higher reliability of electrical connections.

Figure 13:
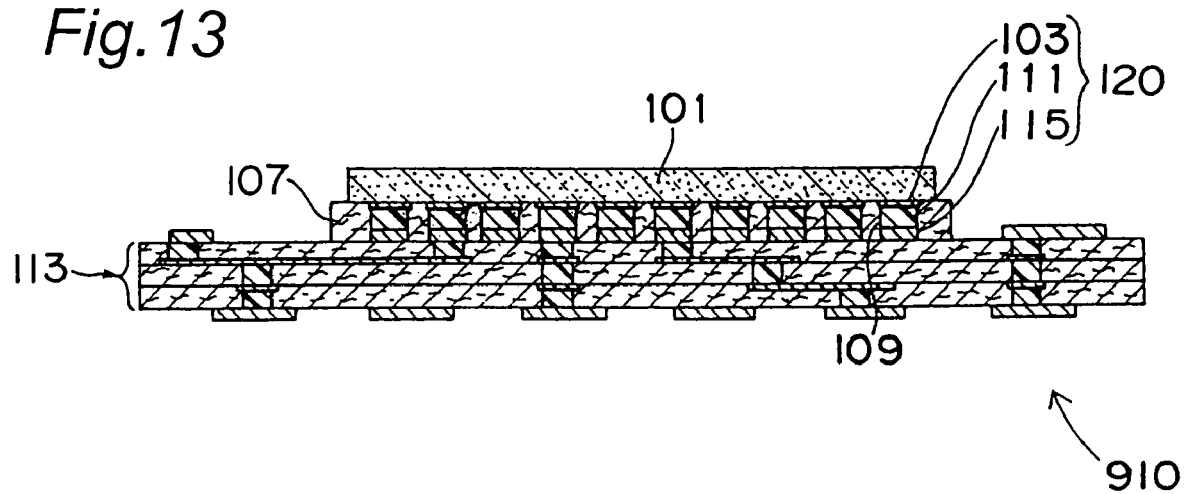
FIG. 13 is a cross sectional view of overall construction of the semiconductor device according to a varied form of Embodiment 2.

FIG. 13 is a cross-sectional diagram showing the overall construction of semiconductor device 910 according to a variation of embodiment 2. Semiconductor device 910 has electrode 115 on circuit substrate 113 formed more thickly and used in place of bump 105 (FIG. 11B). Even burying this electrode 115 in conductive paste 111 in via hole 109 can produce the advantages same as those obtained from semiconductor devices described by now. Adopting this kind of construction can eliminate the bump 105 forming process and achieves better productivity.

Embodiment 3

Figure 14:
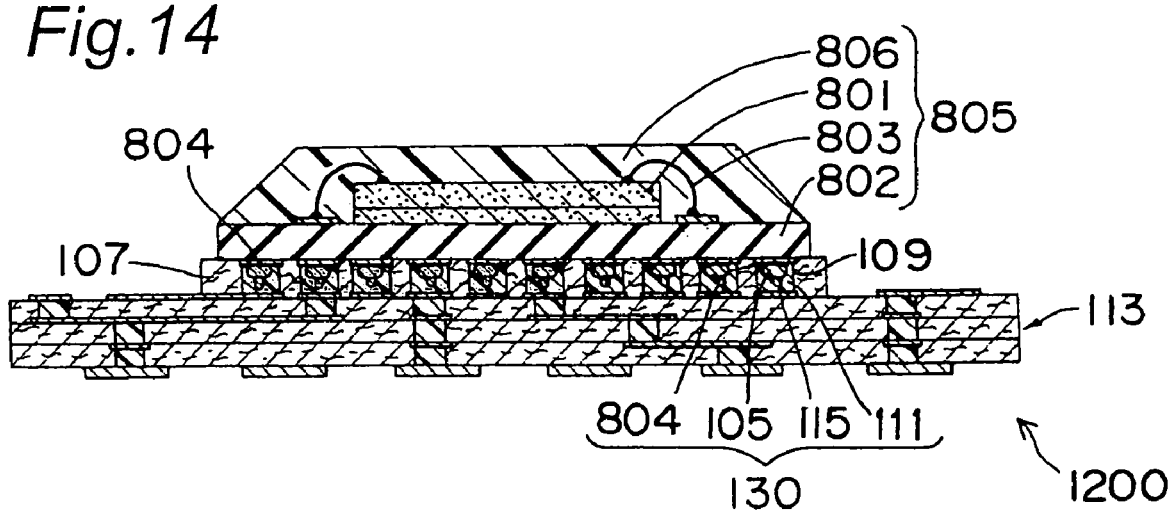
FIG. 14 is a cross sectional view of overall construction of a semiconductor device according to Embodiment 3.

FIG. 14 is a cross-sectional view showing the overall construction of semiconductor device 1200 according to embodiment 3. Semiconductor device 1200 is composed with semiconductor element 101 in semiconductor device 100 (FIG. 3A) replaced with packaged structure 805 of semiconductor element.

Semiconductor device 1200 comprises packaged structure 805, intermediate connector 107, circuit substrate 113, and electrical connections 130. Intermediate connector 107 and circuit substrate 113 are same as embodiments 1 and 2 and detailed description will be omitted.

Packaged structure 805 has circuit substrate 802, semiconductor element 801 mounted on it, metal wire 803 for electrically connecting circuit substrate 802 and semiconductor element 801, and mold resin 806 provided on the surface of circuit substrate 802 in such a manner to cover semiconductor element 801 and metal wire 803.

In this embodiment, packaged structure 805 for packaging semiconductor element 801 secures electrical connections with semiconductor element 801 and circuit substrate 802 by wire bonding. However, the packaged structure is not limited to this configuration but packaged structure 805 may electrically connect semiconductor element 801 and circuit substrate 802 by the use of flip-chip. Or packaged structure 805 may be of configurations of so-called semiconductor packages such as chip size package (CSP), ball grid array (BGA), etc.

Electrical connections 130 are external electrodes of packaged structure 805. Electrical connections 130 has electrode 804 electrically connected to part of the electrodes of semiconductor element 801, bump 105 provided in electrode 804, electrode 115 provided in circuit substrate 113 and corresponding to each of electrodes 804, and conductive paste 111 for connecting bump 105 and electrode 115. Electrode 804 and electrode 115 are connected via intermediate electrical connections comprising bump 105 and conductive paste 111, and electrically connect packaged structure 805 and circuit substrate 113.

In general, packaged structure 805 forms a solder ball on electrode 804 and is electrically connected to circuit substrate 113 by solder connection. However, when electrode 804 is provided at a narrower pitch, there are cases to cause defective shorting across adjoining solder balls. Therefore, in semiconductor device 1200 according to embodiment 3, packaged structure 805 is intended to be mounted to circuit substrate 113 at a narrower pitch without generating shorting across adjoining electrical connections 130.

Semiconductor device 1200 has bump 105 formed on electrode 804 of packaged structure 805 and bump 105 buried in conductive paste 111 filled in via hole 109 provided in intermediate connector 107. Thus, circuit substrate 113 and packaged structure 805 are electrically connected. Furthermore, compressing conductive paste 111 by bump 105 when bump 105 is buried in conductive paste 111 can achieve much more stable electrical connection across circuit substrate 113 and packaged structure 805. By using conductive paste 111 for electrical connection between circuit substrate 113 and packaged structure 805 in this way, stress applied to both connection sections of circuit substrate 113 and packaged structure 805 can be relaxed same as described in embodiment 1, and stable electrical connections can be achieved against dimensional changes caused by thermal shock, etc. In addition, because conductive paste 111 is confined in via hole 109, conductive paste 111 does not stick out to adjoining electrical connections 130 and does not cause shorting in adjoining electrical connections 130. Consequently, electrical connections 130 can be disposed at a still narrower pitch.

Note that, in the present embodiment, a configuration with bump 105 formed on the electrode 804 side is shown. However, bump 105 may be formed on the electrode 115 side of circuit substrate 113. Furthermore, bump 105 may be formed on both electrode 804 side and electrode 115 side.

The shape of bump 105 is not restricted to the two-level protrusion form and bumps of other materials or other forms shown in embodiment 1 may be used.

The electronic parts disposed in circuit substrate 113 via electrical connections 130 at a narrow pitch are not limited to semiconductor elements and semiconductor packaged structures. The same effects can be obtained even when filters, modules, and other electronic parts are used.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a semiconductor device with a semiconductor section and a substrate electrically connected, comprising:
   a forming process which forms semiconductor electrodes at the semiconductor section,
   a forming process which forms substrate electrodes on the circuit substrate,
   a first affixing process which affixes one part of the semiconductor section and the circuit substrate to an intermediate connector made of insulating material,
   a forming process which forms via holes with inclined wall surface thereof in the intermediate connector according to positions of the semiconductor electrodes and positions of the substrate electrodes,
   the forming process including;
   a measuring process which measures at least one of positions of the semiconductor electrodes and positions of the substrate electrodes to obtain positional data;
   a specifying process which specifies positions on the intermediate connector based on the measured positional data; and
   a forming process which forms the each via hole at each of the specified positions on the intermediate connector,
   a connecting process which electrically connects each of the semiconductor electrodes and each of the substrate electrodes via each of the via holes, and
   a second affixing process which affixes the other part of the semiconductor section and the circuit substrate to the intermediate connector.

2. The method for manufacturing a semiconductor device according to claim 1, wherein the connecting process comprising:
   a forming process which forms bumps on at least one of the semiconductor electrodes and the substrate electrodes;
   a filling process which fills conductive paste into the each via hole; and
   a connecting process which buries each of the bumps in the conductive paste in the each via hole to electrically connect the each semiconductor electrode and the each substrate electrode via the each bump and the conductive paste.

3. The method for manufacturing a semiconductor device according to claim 1, wherein each of the semiconductor electrodes and each of the substrate electrodes are metal layers with films, each metal layer containing resin formed on the surface, and wherein the forming process which forms the via holes removes the films to expose the metal layers.

4. The method for manufacturing a semiconductor device according to claim 1, wherein the filling process comprises:

an injecting process which injects the conductive paste from a bottom to a opening section of the each via hole; and a scraping process which scraps away a predetermined volume of the conductive paste from the opening section.

5. The method for manufacturing a semiconductor device according to claim 4, wherein the injecting process applies pressure to the conductive paste to discharge the conductive paste and injects the conductive paste from the bottom to the opening section of the each via hole.

6. The method for manufacturing a semiconductor device according to claim 1, wherein the first affixing process and the second affixing process bring the intermediate connector in close contact with the semiconductor section and the circuit substrate by pressurizing and include a sealing process which seals the each via hole.

7. The method for manufacturing a semiconductor device according to claim 6, wherein the conductive paste contains conductive particles and non-conductive resin, and wherein the sealing process comprises:

a providing process which provides a clearance, through which the nonconductive resin alone to flow, at an interface between the intermediate connector and at least one part of the semiconductor section and the circuit substrate; and a densifying process which densifies the conductive paste by pressurizing and allowing the nonconductive resin to flow from the each via hole to seal the each via hole with the conductive particles remained.

8. The method for manufacturing a semiconductor device according to claim 1, wherein the intermediate connector is further made of a material that contracts by pressurizing, and wherein the first affixing process and the second affixing process contract the intermediate connector by pressurizing to densify the conductive paste.

9. The method for manufacturing a semiconductor device according to claim 1, wherein the intermediate connector is further made of thermosetting resin, and wherein the first affixing process hardens part of the intermediate connector containing thermosetting resin by heating to affix the semiconductor section and the circuit substrate to the intermediate connector.

10. The method for manufacturing a semiconductor device according to claim 9, wherein the second affixing process hardens the intermediate connector by heating to affix the semiconductor section and the circuit substrate to the intermediate connector.

11. The method for manufacturing a semiconductor device according to claim 4, wherein the injecting process applies pressure to the conductive paste to discharge with volume smaller than first volume of each via hole and greater than second volume obtained by subtracting volume of each bump from the first volume.

12. A method for manufacturing a semiconductor device with a semiconductor section and a substrate electrically connected, comprising:

a forming process which forms semiconductor electrodes at the semiconductor section, a forming process which forms substrate electrodes on the circuit substrate, a first affixing process which affixes one part of the semiconductor section and the circuit substrate to an intermediate connector made of insulating material, a forming process which forms via holes with inclined wall surface thereof in the intermediate connector according to positions of the semiconductor electrodes and positions of the substrate electrodes, a connecting process which electrically connects each of the semiconductor electrodes and each of the substrate electrodes via each of the via holes, a second affixing process which affixes the other part of the semiconductor section and the circuit substrate to the intermediate connector;

a forming process which forms bumps on at least one of the semiconductor electrodes and the substrate electrodes, wherein each bump has a tapered shape;

a filling process which fills conductive paste into the each via hole; and a connecting process which buries each of the bumps in the conductive paste in the each via hole to electrically connect the each semiconductor electrode and the each substrate electrode via the each bump and the conductive paste.

13. The method for manufacturing a semiconductor device according to claim 2, wherein a bump diameter at head end section is smaller than a bump diameter at lower level section.

* * * * *

UNITED STATES PATENT AND TRADEMARK OFFICE
CERTIFICATE OF CORRECTION

PATENT NO. : 7,247,508 B2  Page 1 of 1
APPLICATION NO. : 11/064282
DATED : July 24, 2007
INVENTOR(S) : Hideki Higashitani, Tadashi Nakamura and Daizo Andoh It is certified that error appears in the above-identified patent and that said Letters Patent is hereby corrected as shown below:

On the Title Page, FIELD [30], Foreign Application Priority Data, "Apr. 20, 2001" should read --Apr. 25, 2001--

Signed and Sealed this

Twenty-ninth Day of April, 2008

JON W. DUDAS
*Director of the United States Patent and Trademark Office*